(12) United States Patent
Horsfield et al.

(10) Patent No.: US 11,233,585 B2
(45) Date of Patent: Jan. 25, 2022

(54) SYSTEM AND APPARATUS FOR IDENTIFYING FAULTS IN A RADIO FREQUENCY DEVICE OR SYSTEM

(71) Applicant: KAELUS PTY LTD, Cannon Hill (AU)

(72) Inventors: Brendan Horsfield, Cannon Hill (AU); Mostafa Mohamed Taher Abushaaban, Murarrie (AU); Frank John Strachan, Cannon Hill (AU)

(73) Assignee: KAELUS PTY LTD, Queensland (AU)

(*) Notice: Subject to any disclaimer, the term of this patent is extended or adjusted under 35 U.S.C. 154(b) by 51 days.

(21) Appl. No.: 16/626,982

(22) PCT Filed: Jun. 27, 2018

(86) PCT No.: PCT/AU2018/050650
§ 371 (c)(1),
(2) Date: Dec. 27, 2019

(87) PCT Pub. No.: WO2019/000034
PCT Pub. Date: Jan. 3, 2019

(65) Prior Publication Data
US 2020/0259573 A1    Aug. 13, 2020

(30) Foreign Application Priority Data
Jun. 27, 2017 (AU) ............................... 2017902472

(51) Int. Cl.
*H04B 17/17* (2015.01)
*H04B 17/10* (2015.01)
*H04B 17/12* (2015.01)

(52) U.S. Cl.
CPC ........... *H04B 17/17* (2015.01); *H04B 17/102* (2015.01); *H04B 17/103* (2015.01); *H04B 17/12* (2015.01)

(58) Field of Classification Search
CPC .... H04B 17/17; H04B 17/102; H04B 17/103; H04B 17/12; G01R 23/20; G01R 27/32
See application file for complete search history.

(56) References Cited

U.S. PATENT DOCUMENTS

| | | | | |
|---|---|---|---|---|
| 4,815,075 A * | 3/1989 | Cameron | ............ | H04J 1/12 370/497 |
| 6,219,470 B1 * | 4/2001 | Tu | ............ | G02B 6/4204 385/14 |
| 7,447,191 B2 * | 11/2008 | Mouton | ............ | H04L 5/20 370/200 |
| 8,761,026 B1 * | 6/2014 | Berry | ............ | H01P 5/12 370/241 |
| 9,210,598 B1 * | 12/2015 | Bradley | ............ | H04B 3/46 |
| 10,038,522 B1 * | 7/2018 | Ju | ............ | H04L 1/243 |

(Continued)

*Primary Examiner* — Dominic E Rego
(74) *Attorney, Agent, or Firm* — Lathrop GPM LLP

(57) ABSTRACT

A system for identifying faults in a radio frequency device under test, the system including a passive intermodulation test module, configured to perform passive intermodulation testing of the device under test on at least one test port; and an in-line S-parameter test set, coupled to the passive intermodulation test module and intermediate the passive intermodulation test module and at least one test port, and configured to perform wideband S-parameter testing of the device under test on the at least one test port.

18 Claims, 9 Drawing Sheets

(56) References Cited

U.S. PATENT DOCUMENTS

| | | | |
|---|---|---|---|
| 2001/0004729 A1* | 6/2001 | Metzger | G01R 31/2822 702/104 |
| 2004/0151195 A1* | 8/2004 | Donoghue | H04L 49/1515 370/412 |
| 2005/0271068 A1* | 12/2005 | Hetzel | H04L 12/43 370/403 |
| 2007/0007981 A1* | 1/2007 | Golan | G01R 31/2894 324/754.03 |
| 2010/0290785 A1* | 11/2010 | Hinderthur | H04J 14/02 398/79 |
| 2014/0049267 A1* | 2/2014 | Cordaro | G01R 23/20 324/624 |
| 2016/0028497 A1* | 1/2016 | Holt | H04B 17/0085 375/228 |
| 2016/0238790 A1* | 8/2016 | Chen | G02B 6/4208 |
| 2017/0122990 A1* | 5/2017 | Massa | G01R 31/2853 |
| 2017/0126195 A1* | 5/2017 | Morgan | H01P 1/201 |
| 2018/0246153 A1* | 8/2018 | Pandya | G01R 27/28 |
| 2018/0342779 A1* | 11/2018 | Grassl | H01P 7/04 |

* cited by examiner

SYSTEM AND APPARATUS FOR IDENTIFYING FAULTS IN A RADIO FREQUENCY DEVICE OR SYSTEM

TECHNICAL FIELD

The present invention relates to the identification of faults in a radio frequency (RF) device or system. In particular, although not exclusively, the present invention relates to passive intermodulation distortion and scattering parameters testing.

BACKGROUND ART

Passive intermodulation distortion (PIM) and scattering parameters (S-parameters) are among the most important figures of merit in RF components and communication systems. Both PIM and S-parameters are commonly measured during the manufacture, installation and commissioning of new RF infrastructure. In particular, PIM and S-parameters are used by research and development engineers during the development of a new product, by factory staff during the manufacturing process, and field staff when installing or repairing an RF component or system.

Traditionally the measurement of PIM and S-parameters required two distinct test instruments, namely, a PIM analyser and a vector network analyser (VNA), with each quantity being tested separately. In one prior art approach, PIM and S-parameter testing is performed sequentially, by separately and manually connecting a PIM analyser and a VNA to the device under test (DUT).

Such an approach is inexpensive as it requires no additional hardware or software. However, it has at least two key disadvantages. Firstly, the tests are relatively slow to perform, as the testing process is interrupted when the operator manually disconnects the PIM analyser and installs the VNA (or vice versa). This is especially inefficient in a high-volume manufacturing environment, where cycle time is a critical parameter that must be minimised wherever possible. Secondly, such an approach increases wear on a connector of the DUT, as the connector must be connected and disconnected to the PIM analyser and again for the VNA.

Attempts have been made to overcome these problems by providing for simultaneous connection of both the PIM analyser and the VNA to the DUT using an RF switch. Such an approach speeds up the testing process, as it enables the operator to switch between the two test instruments more quickly than manual connection and disconnection, and reduces human error. Furthermore, the use of an RF switch minimises wear and tear on the connector of the DUT, as it only requires one connection to be made for both tests.

However, the use of an RF switch in such testing has a number of disadvantages. In particular, the RF switch must be able to handle RF power levels of potentially hundreds of watts. Furthermore, the RF switch must have extremely low residual PIM, ideally less than −130 dBm with 2×+43 dBm carriers, even after thousands of switching operations. These requirements are difficult to meet in practice in an RF switch, which results in the RF switches being very costly, often in the range of several thousand dollars for a single RF switch module.

Range-to-Fault (RTF) test modules exist, which are retrofittable devices, including an in-line vector reflectometer, that may be coupled to a PIM analyser to perform both vector PIM and vector reflection coefficient measurements with a single test set, and on the same test port. An example of such an RTF module is provided in U.S. Pat. No. 9,225,441.

Unfortunately, however, and as described in further detail below, the RTF module is limited in that its frequency sweep range in reflectometer mode is restricted to the transmit and receive bands of the PIM analyser to which it is connected. This restriction prevents the RTF module from being used as a general-purpose wideband reflectometer, which limits its use cases to a narrow range of niche applications.

In particular, a vector reflectometer measures a vector reflection coefficient $\Gamma_L$ of a DUT by applying a test signal to an input port of the DUT, and measuring the amplitude ratio and phase offset between the incident signal "a" and reflected signal "b" at that port.

FIG. 1 illustrates a block diagram of a conventional vector reflectometer test system 100, according to the prior art. The test system 100 includes a vector reflectometer 105 which is coupled to a DUT 110 by a test port 115.

The vector reflectometer 105 comprises an RF source 120 for generating a test signal, a forward directional coupler 125a and reverse directional coupler 125b for sampling the incident and reflected signals to and from the DUT 110 respectively, a pair of coherent receivers 130, 140 for downconverting the sampled signals to a lower intermediate frequency (IF), and an amplitude/phase detector 135 for measuring the complex ratio of the downconverted signals $b_m$ and $a_m$.

By performing a suitable calibration procedure prior to the commencement of testing, it is possible to post-process the measured results in a computer or microcontroller and obtain the vector reflection coefficient $\Gamma_L$ of the DUT 110.

FIG. 2 illustrates a block diagram of an in-line vector reflectometer test system 200, according to the prior art. The test system 200 includes a one-port PIM analyser 205, an in-line vector reflectometer 210 and a DUT 215.

The in-line reflectometer 210 is a two-port device designed to be connected in cascade with another piece of equipment, and comprises an input port 220 coupled to the one-port PIM analyser 205, and a test port 225 with which the DUT 215 is connected.

While the input port 220 (also referred to as the "upstream port") connects the reflectometer 210 to the PIM analyser 205, the skilled addressee will readily appreciate that the in-line reflectometer 210 can be cascaded with a wide range of other devices.

To make a reflection coefficient measurement, an RF source 230 inside the in-line reflectometer 210 generates a test signal which is coupled onto the main RF path in the direction of the DUT 215 by a directional coupler 235 (also referred to as "source coupler"). The reflectometer then measures the amplitude ratio and phase offset between the incident and reflected signals in the same fashion as the reflectometer 105 of FIG. 1, and processes these measurements in a computer or microcontroller in order to compute the DUT reflection coefficient $\Gamma_L$.

The in-line vector reflectometer architecture described above is inherently wideband in design, capable in principle of making measurements across hundreds of megahertz (MHz) or even several gigahertz (GHz) of bandwidth. In practice, however, the operating frequency range of the in-line reflectometer is restricted to the frequency band of the PIM analyser to which it is connected.

In particular, in order to make accurate reflection coefficient measurements, an in-line reflectometer requires the output return loss of the PIM analyser to be greater than some minimum threshold, which may be around 6 dB. If this requirement is not met, a pathological scenario can arise when measuring a highly reflective DUT, whereby a resonant mode is excited between the PIM analyser and the DUT at certain frequencies. Under these conditions, the resulting accumulation of power inside the in-line reflectometer can cause the receivers to saturate, resulting in a severe loss of accuracy at those frequencies.

The minimum output return loss requirements are often met by PIM analysers in their transmit and receive bands, where values are in the 10-15 dB range, for example. However, outside of their transmit and receive bands, PIM analysers of the prior art usually become highly reflective, with a typical output return loss of 1 dB or less. As a result, the operating frequency range of the reflectometer in prior art RTF modules has hitherto been restricted to the transmit band of the PIM analyser to which it is connected.

This phenomenon is illustrated in an example, as follows. FIG. 3 illustrates a block diagram of an in-line vector reflectometer test system 300, according to the prior art. The test system 300 includes a one-port PIM analyser 305, the in-line vector reflectometer 210 and the DUT 215.

The PIM analyser 305 is an 1800 MHz PIM analyser, whose RF front end contains a duplexer 310 comprising a transmit filter 315a and receive filter 315b that have been joined together at the port 220 by means of a pair of carefully chosen transmission lines 320, often referred to as a "manifold".

The use of a manifold-coupled duplexer 310 to combine transmit and receive bands onto a shared port 220 in this fashion, along with related variants such as corresponding triplexers and quadruplexers, is used in all commercially available PIM analysers.

One of the characteristics of these manifold-coupled duplexers, triplexers and quadruplexers is that they are highly reflective at frequencies outside of their passbands. Consider the output return loss response 400 of the aforementioned 1800 MHz duplexer 310, which is illustrated in FIG. 4.

In the receive and transmit bands 405a, 405b of the duplexer 310, which span the frequency ranges 1710-1785 MHz and 1805-1880 MHz respectively, the output return loss is typically better than 15 dB. Outside of these bands 405a, 405b, however, the output return loss is close to 0 dB.

The highly reflective behaviour of the duplexer 310 in its stopband can cause problems for the in-line reflectometer 210 if the DUT 215 is also highly reflective. Specifically, at certain critical frequencies related to the electrical distance between the duplexer 310 and the DUT 215, the phase of the duplexer's output reflection coefficient and the phase of the DUT's input reflection coefficient, a resonant mode can be excited that causes large amounts of power to accumulate between the duplexer 310 and the DUT 215. This in turn increases the amount of power that enters the reflectometer 210 via its forward and reverse directional couplers 125a, 125b. In extreme cases, this resonance-induced power rise can be enough to saturate the reflectometer's receivers, thereby causing a serious loss of measurement accuracy at those frequencies.

This phenomenon is illustrated in FIG. 5, which shows simulated outputs 500, including simulated outputs 505a, 505b from the forward and reverse directional couplers 125a, 125b respectively in the reflectometer 210 of FIG. 3, during a measurement sweep into a highly reflective DUT 215 (such as, and in this case, an open-circuited length of transmission line).

As shown in FIG. 5, in the transmit and receive bands 405a, 405b of the PIM analyser 305, where the instrument's output return loss is high, the outputs 505a, 505b from the reflectometer's forward and reverse couplers 125a, 125b respectively are relatively constant, exhibiting only a couple of dB of variation within those bands.

By contrast, at frequencies outside the transmit and receive bands 405a, 405b of the PIM analyser 305, where the instrument's output return loss is very low, the outputs 505a, 505b from the reflectometer's forward and reverse couplers 125a, 125b respectively exhibit large amplitude variations over frequency, rising up to 30 dB above the levels that are observed in the transmit and receive bands 405a, 405b. In most real-life in-line reflectometers, including prior RTF modules, this rise would be more than enough to saturate both receivers, thereby causing a serious loss of measurement accuracy at those frequencies.

Further insight into the conditions necessary for a resonant mode to be excited between the PIM analyser 305 and the DUT 215 can be obtained from an approximate mathematical model of the signals entering the reflectometer 210 during a measurement sweep.

The mathematical model is based on the reflectometer 210 of FIGS. 2 and 3, with terminating impedances attached to the port 220 and the test port 225. The terminating impedances represent the reflection coefficients $\Gamma_S$ and $\Gamma_L$ of the PIM analyser 205, 305 and the DUT 215 respectively.

The following analysis assumes that the insertion loss between the reflectometer's upstream port 220 and test port 225 is negligible, and that the source coupler 235, forward coupler 125a and reverse coupler 125b are all loosely coupled to the main RF path through the reflectometer.

During a measurement sweep, the RF source 230 inside the reflectometer 210 generates a test signal $a_1$, which is coupled onto the main RF path in the direction of the DUT 215 via the source coupler 235. The forward-travelling test signal is sampled by the forward directional coupler 125a, while the signal reflected from the DUT 215 is sampled by the reverse directional coupler 125b.

Let $a_m$ denote the output signal from the forward coupler, and $b_m$ denote the output signal from the reverse coupler:

$$a_m = a_1 C_s C_f \left( \frac{1 + D_f \Gamma_L}{1 - \Gamma_L \Gamma_S e^{-j2\theta}} \right) \quad \text{(Equation 1)}$$

$$b_m = a_1 C_s C_r \left( \frac{D_r + \Gamma_L}{1 - \Gamma_L \Gamma_S e^{-j2\theta}} \right) \quad \text{(Equation 2)}$$

where
  $a_1$=test signal from RF source inside reflectometer
  $a_m$=signal at output of forward coupler
  $b_m$=signal at output of reverse coupler
  $C_s$, $C_f$ & $C_r$=coupling coefficients of source coupler, forward coupler and reverse coupler respectively
  $D_f$ & $D_r$=directivities of forward coupler and reverse coupler respectively
  $\Gamma_S$ & $\Gamma_L$=complex reflection coefficients of PIM analyser and DUT respectively
  $\theta$=electrical length of transmission line between PIM analyser and DUT, including the electrical length of the reflectometer Equations 1 and 2 share a common denominator, $(1-\Gamma_L\Gamma_S e^{-j2\theta})$, which is at a minimum whenever the following phase condition is satisfied:

$$\angle\Gamma_S + \angle\Gamma_L - 2\theta = \pm 2n\pi \ (n=0,1,2,\ldots) \quad \text{(Equation 3)}$$

where

<$\Gamma_S$=phase of output reflection coefficient of PIM analyser

<$\Gamma_L$=phase of input reflection coefficient of DUT

When the reflectometer makes an in-band measurement, the magnitude of the PIM analyser's output reflection coefficient $|\Gamma_S|$ is close to zero. This means that the minimum possible value of the denominator $(1-\Gamma_L\Gamma_S e^{-j2\theta})$ is always close to one, irrespective of whether or not the phase condition in Equation 3 is met. Under these conditions the magnitudes of $a_m$ & $b_m$ are guaranteed to be finite for all values of $\Gamma_L$ in the range $|\Gamma_L|\leq 1$.

By contrast, when the reflectometer makes an out-of-band return loss measurement, the magnitude of the PIM analyser's output reflection coefficient $|\Gamma_S|$ is usually close to one. If the DUT is highly reflective at the frequency of interest, the magnitude of the DUT's input reflection coefficient $|\Gamma_L|$ will also be close to one. Under these conditions, if the phase condition in Equation 3 is simultaneously satisfied, the denominator $(1-\Gamma_L\Gamma_S e^{-j2\theta})$ will approach zero and the magnitudes of $a_m$ & $b_m$ approach infinity, clearly a very undesirable outcome.

As such, there is clearly a need for improved systems and apparatus for identifying faults in a radio frequency device or system.

It will be clearly understood that, if a prior art publication is referred to herein, this reference does not constitute an admission that the publication forms part of the common general knowledge in the art in Australia or in any other country.

SUMMARY OF INVENTION

The present invention is directed to systems and apparatus for identifying faults in a radio frequency device or system, which may at least partially overcome at least one of the abovementioned disadvantages or provide the consumer with a useful or commercial choice.

With the foregoing in view, the present invention in one form, resides broadly in a system for identifying faults in a radio frequency device under test (DUT), the system including:

a passive intermodulation (PIM) test module, configured to perform passive intermodulation testing of the device under test on at least one test port; and an in-line S-parameter test set, coupled to the passive intermodulation test module and intermediate the passive intermodulation test module and at least one test port, and configured to perform wideband S-parameter testing of the device under test on the at least one test port.

In yet another form, the invention resides broadly in a system for identifying faults in a radio frequency device under test, the system including a passive intermodulation test module configured to perform passive intermodulation testing of the device under test on at least one test port, the passive intermodulation test module including:

a transmit module configured to provide, on at least one test port, at least one test signal for passive intermodulation testing a device under test; and a receive module configured to receive, on the at least one test port, passive intermodulation signals produced by the device under test in response to the test signal.

The transmit module and the receive module may be coupled to the at least one test port by a reflectionless multiplexer. The reflectionless multiplexer may be a hybrid-coupled multiplexer.

Advantageously the system enables passive intermodulation and wideband S-parameter testing without requiring any physical connection changes on the at least one test port between the passive intermodulation testing and the wideband S-parameter testing, and without requiring RF switching between the passive intermodulation test module and the in-line S-parameter test set. The system may advantageously enable accurate wideband S-parameter testing even when the DUT is highly reflective.

Preferably, the in-line S-parameter test set is configured to perform wideband S-parameter testing both inside and outside of the transmit and receive bands of the passive intermodulation test module.

The in-line S-parameter test set may comprise a range-to-fault (RTF) module.

The in-line S-parameter test set may comprise a vector reflectometer.

The at least one test port may comprise a single test port.

The at least one test port may comprise two test ports. Such a configuration may enable forward and reverse passive intermodulation testing and/or full two-port S-parameter testing in either direction.

The in-line S-parameter test set may comprise a two-port in-line S-parameter test set coupled to the first and second test ports of the two test ports.

The in-line S-parameter test set may comprise first and second separate in-line reflectometers, one coupled to each of the first and second test ports of the two test ports.

The in-line S-parameter test set may comprise an RF source for generating a test signal, coupled to the one or more test ports by one or more directional couplers. Such a configuration enables the S-parameter test set to operate as an independent in-line device situated between the passive intermodulation analyser and the DUT.

The passive intermodulation test module may be coupled to the in-line S-parameter test set by a hybrid-coupled multiplexer. The hybrid-coupled multiplexer may be configured to provide a high output return loss over a wide bandwidth.

The hybrid-coupled multiplexer may include two or more independent channelising networks connected in cascade, followed by a matched load.

Each channelising network may comprise two identical quadrature hybrids and a pair of identical filters. Furthermore, each channelising network may correspond to a particular frequency range.

The two or more independent channelising networks may include one channelising network spanning a transmit band of the PIM test module, and another channelising network spanning a receive band of the PIM test module.

In one embodiment, the hybrid-coupled multiplexer comprises a duplexer including two independent channelising networks.

The PIM test module may comprise a multiband PIM analyser capable of measuring PIM in two or more non-overlapping cellular bands on a single test port. Alternatively, the PIM test module may comprise a PIM analyser in which each transmit carrier is individually filtered before being combined with another carrier at the test port. Alternatively again, the PIM test module may comprise a PIM analyser with a single transmit band and multiple receive bands.

In an alternative embodiment, the PIM test module may be coupled to the in-line S-parameter test set by cascaded directional filters.

The in-line S-parameter test set may be configured to provide dynamic source power control.

The in-line S-parameter test set may be configured to adjust a stimulus level dynamically during an S-parameter measurement sweep using a variable attenuator.

The system may include a control system configured to monitor receiver output levels in the in-line S-parameter test set, and adjust the variable attenuator based upon the monitored output levels.

The control system may be configured to compare the monitored receiver output levels to one or more thresholds, and adjust the variable attenuator to bring the receiver output levels to within the one or more thresholds.

The control system may pause the S-parameter measurement sweep, adjust the variable attenuator, and resume the S-parameter measurement sweep with the new attenuator settings. This process may be repeated until the monitored receiver output levels are brought to within one or more thresholds, and over all frequencies of the S-parameter measurement sweep.

The variable attenuator may be provided on an output of an RF source of the S-parameter test set.

The system may include an attenuator between the PIM test module and the in-line S-parameter test set. The attenuator may improve the output return loss of the PIM analyser. The attenuator may comprise a fixed attenuator.

The PIM test module may be configured to compensate for the insertion loss of the attenuator.

The PIM test module may be configured to compensate for the insertion loss of the attenuator by amplifying an output signal of the PIM test module. Alternatively, the PIM test module may be configured to compensate for the insertion loss of the attenuator by using a pulsed mode of operation, thereby allowing higher power levels to be generated for brief time intervals (e.g. 100 milliseconds). Alternatively, again, the PIM test module may be configured to compensate for the insertion loss of the attenuator by combining two transmit tones using a diplexer to increase the power output of the PIM test module.

The PIM test module may comprise a multi port PIM test module, and an attenuator may be fitted onto each port of the PIM analyser.

The system may include a pair of in-line vector reflectometers between the attenuators and the DUT.

In another form, the invention resides broadly in a passive intermodulation test module configured to perform passive intermodulation testing of a device under test on at least one port, the passive intermodulation test module including:

a transmit module, configured to provide, on at least one test port, at least one test signal for passive intermodulation testing a DUT; and a receive module, configured to receive, on the at least one test port, passive intermodulation signals produced by the DUT in response to the test signal;

wherein the transmit module and the receive module are coupled to the at least one test port by a reflectionless multiplexer.

The reflectionless multiplexer may be a hybrid-coupled multiplexer. The hybrid-coupled multiplexer may be configured to provide a high output return loss over a wide bandwidth.

In yet another form, the invention resides broadly in an in-line S-parameter test set for use in a system for identifying or locating faults, the in-line S-parameter test set including:

an RF source, for generating a test signal, coupled between an input and an output of the in-line S-parameter test set by one or more directional couplers; and a variable attenuator, configured to provide dynamic source power control of the RF source.

The in-line S-parameter test set may be configured to adjust a stimulus level dynamically during an S-parameter measurement sweep.

In yet another form, the invention resides broadly in a system for identifying faults in a radio frequency device under test (DUT), the system including:

at least one input, for coupling to a radio frequency device;

at least one output, for coupling to the DUT;

an in-line S-parameter test set coupled between the at least one input and the at least one output, and configured to perform wideband S-parameter testing of the DUT; and an attenuator between the PIM test module and the at least one input.

The attenuator may improve the output return loss of the radio frequency device.

The attenuator may comprise a fixed attenuator.

Any of the features described herein can be combined in any combination with any one or more of the other features described herein within the scope of the invention.

The reference to any prior art in this specification is not, and should not be taken as an acknowledgement or any form of suggestion that the prior art forms part of the common general knowledge.

BRIEF DESCRIPTION OF DRAWINGS

Various embodiments of the invention will be described with reference to the following drawings, in which.

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way.

DESCRIPTION OF EMBODIMENTS

Systems and methods for identifying and/or locating faults in a DUT are described below in which the abovementioned frequency restrictions are eliminated or reduced.

In short, embodiments of the invention described below address the abovementioned degradation in an RTF module's reflection coefficient measurement accuracy when testing highly reflective devices at frequencies outside of the transmit and receive bands of the PIM analyser. This enables the RTF module to be used as a general-purpose wideband one-port VNA.

The systems are described with reference to in-line vector reflectometers, of which an example is an RTF module. For the sake of clarity, such reflectometers are referred to broadly as "in-line vector reflectometers" or "in-line S-parameter test sets", but the skilled addressee will readily appreciate that the RTF is an example of such a reflectometer.

Figure 6:
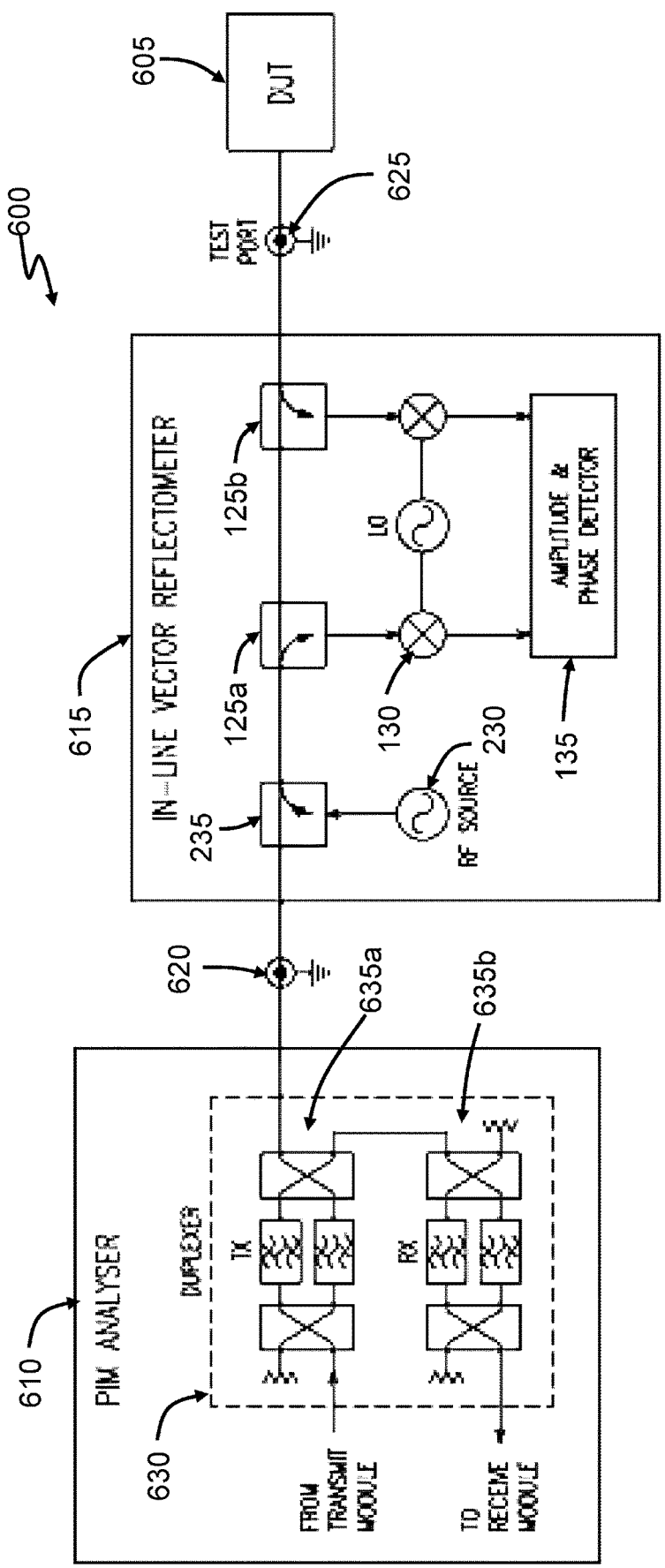
FIG. 6 illustrates a system for identifying and/or locating faults in a DUT, according to an embodiment of the present invention.

FIG. 6 illustrates a system 600 for identifying and/or locating faults in a DUT 605, according to an embodiment of the present invention. The system 600 enables switchless PIM and wideband S-parameter testing using a common test port and provides a high output return loss over a wide frequency range.

The system 600 includes a PIM analyser 610, and an in-line vector reflectometer 615, for PIM and wideband S-parameter testing respectively. The PIM analyser 610 is coupled to the in-line vector reflectometer 615 by an input port 620, and the in-line vector reflectometer 615 is coupled to the DUT 605 by a test port 625, similar to the system 300 of FIG. 3.

The PIM analyser 610 is generally of the type disclosed in United States Patent Application Publication number US20090125253 and United States Patent Application Publication number US20090096466, the disclosure of which are herein incorporated by reference, which are modified as outlined below.

In particular, PIM analyser 610 includes a duplexer 630 in the form of a reflectionless multiplexer. The reflectionless multiplexer is capable of providing high output return loss over a wide bandwidth.

In the embodiment of the present invention as shown in FIG. 6, the reflectionless multiplexer is in the form of a hybrid-coupled multiplexer which consists of two independent channelising networks 635a, 635b connected in cascade.

Figure 1:
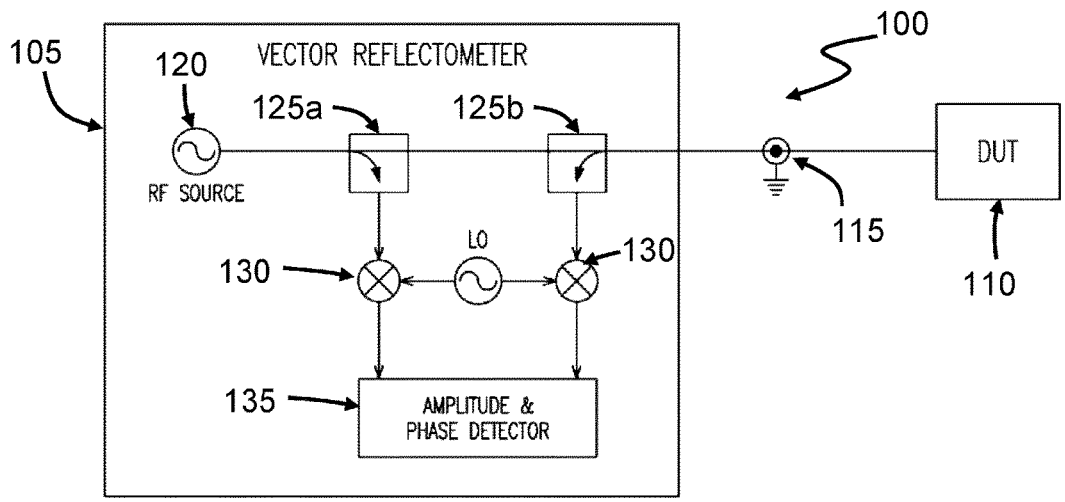
FIG. 1 illustrates a block diagram of a conventional single port vector reflectometer test system, according to the prior art.
Figure 2:
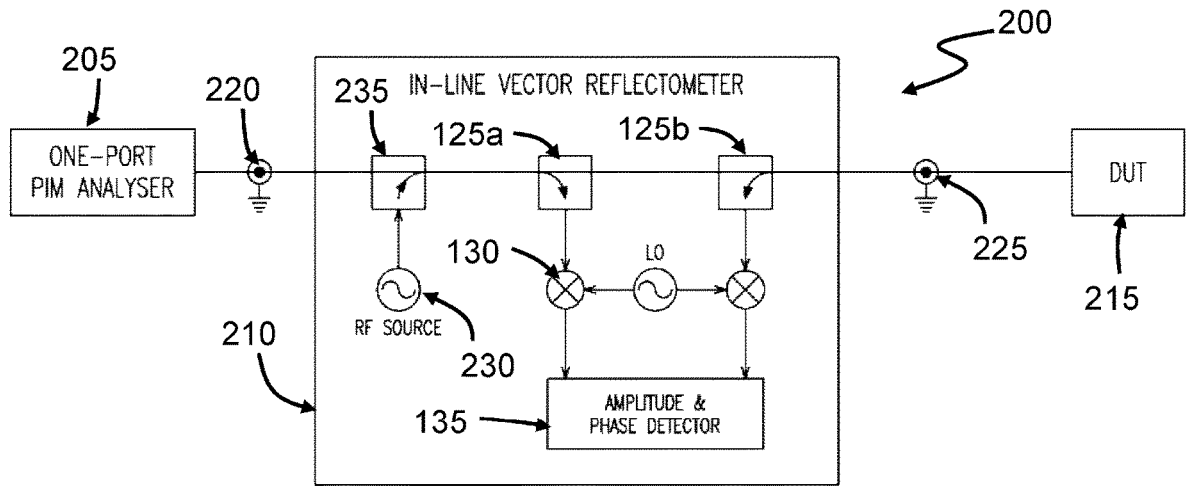
FIG. 2 illustrates a block diagram of an in-line vector reflectometer test system, according to the prior art.
Figure 3:
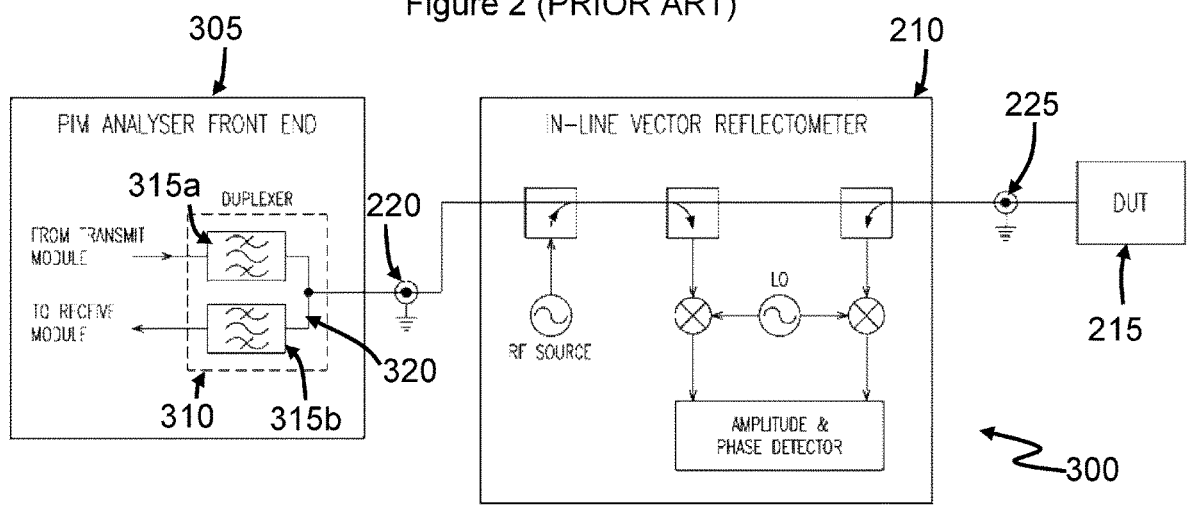
FIG. 3, illustrates a block diagram of an in-line vector reflectometer test system, according to the prior art.
Figure 4:
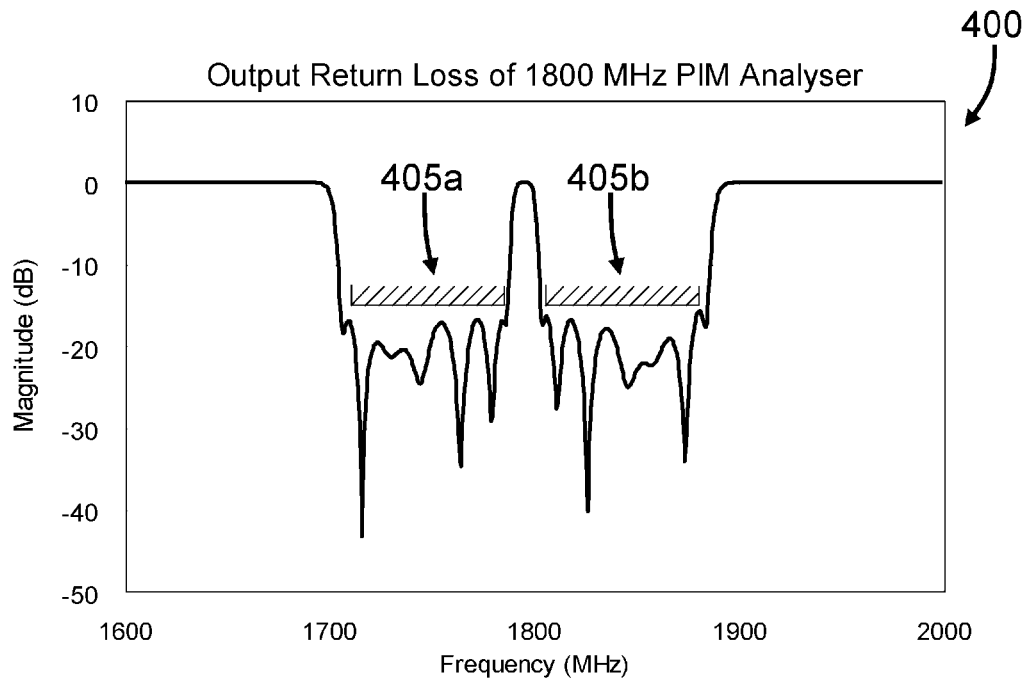
FIG. 4 illustrates an output return loss response of an 1800 MHz duplexer of a test system.
Figure 5:
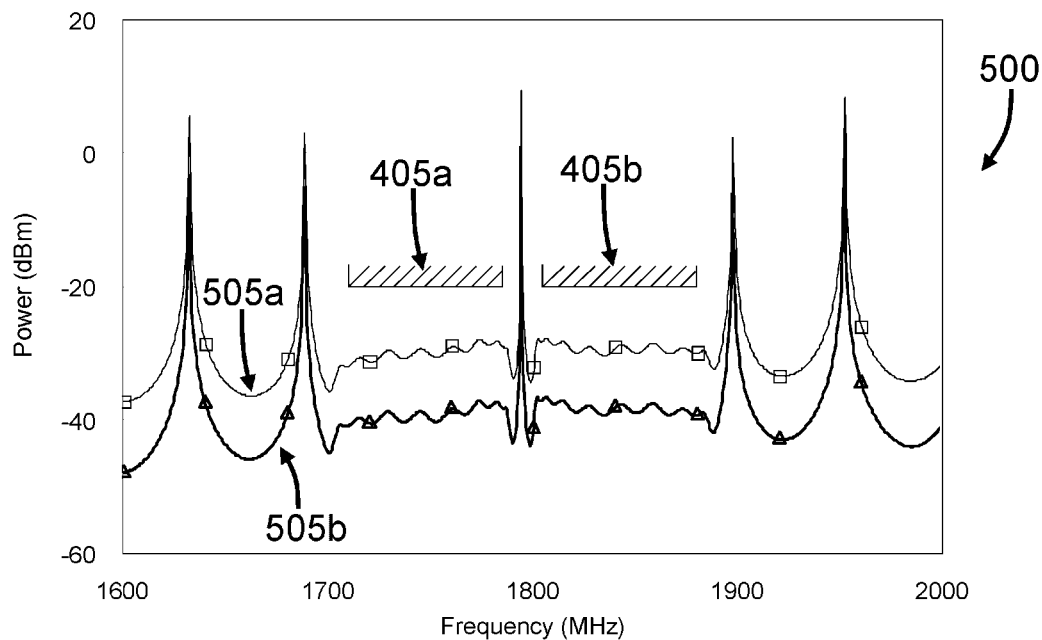
FIG. 5 illustrates simulated outputs from the forward and reverse directional couplers in a reflectometer of a test system.

When compared with the PIM analyser 305 of FIG. 3, it can be seen that the duplexer 630 has been changed from a traditional manifold-coupled design (as was the case on the PIM analyser 305) to a hybrid-coupled multiplexer design, which is capable of providing high output return loss over a wide bandwidth.

Figure 7:
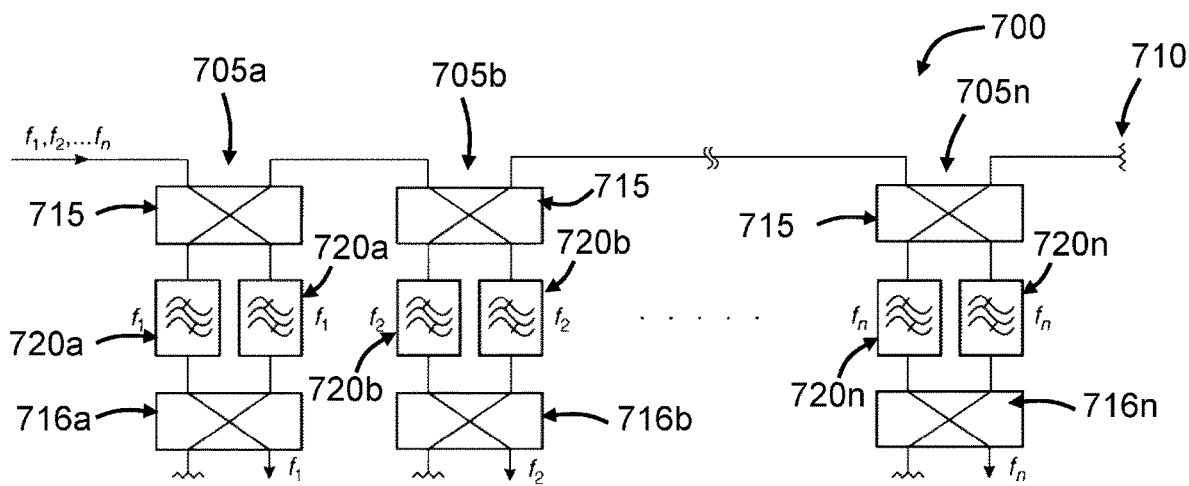
FIG. 7 illustrates a block diagram of a known hybrid-coupled multiplexer, as configured in accordance with an embodiment of the present invention.

FIG. 7 illustrates a block diagram of a known hybrid-coupled multiplexer 700, configured in accordance with an embodiment of the present invention. The hybrid-coupled multiplexer 700 includes two or more independent channelising networks 705a, 705b, 705n connected in cascade, followed by a matched load 710.

The hybrid coupled duplexer 630 of the PIM analyser 610 is a specific example of the hybrid-coupled multiplexer 700 having two channelising networks 705, namely channelising networks 635a, 635b.

Each channelising network 705 comprises two quadrature hybrids 715 and a pair of identical filters 720a, 720b, 720n. In each case, the quadrature hybrid 715 that is located on the side adjacent to the common port of the multiplexer must be capable of operation over a bandwidth equal to the operating frequency range of the in-line vector reflectometer. The quadrature hybrids 716a, 716b, 716n that are located on the other side of filter pairs 720a, 720b, 720n respectively are only required to operate over a bandwidth equal to the bandwidth of the filter pair to which they are connected. As such, these quadrature hybrids 716a, 716b, 716n can be designed to less stringent specifications than the quadrature hybrids 715 located on the side adjacent to the common port. Each channelising network 705 corresponds to a particular frequency f1, f2, fn, and each pair of filters 720a, 720b, 720n is designed to pass the frequency corresponding to that channel 705, while rejecting any other frequencies.

Thus, a signal entering the multiplexer 700 will propagate through the cascade of channelising networks 705a, 705b, 705n until it encounters a channel 705 whose passband spans the frequency range occupied by the signal. The signal enters that channel 705 and is absorbed by the circuitry that follows thereafter.

In the event that the signal does not fall within the passband of any of the channels 705 in the multiplexer 700, the signal continues through the network until it is absorbed by the matched load 710, which is located after the last channel 705 in the cascade.

In theory, with ideal quadrature hybrids, identically tuned pairs of filters, perfectly matched terminations on the output of each channel and a perfectly matched termination 710 after the last channel 705 in the cascade, the hybrid-coupled multiplexer 700 has infinite output return loss across an infinite frequency range. In practice, however, it is possible to use finite bandwidth quadrature hybrids and imperfectly tuned pairs of filters while providing an output return loss that far exceeds what can be achieved with a manifold-coupled multiplexer, such as the duplexer 310, in terms of both return loss magnitude and bandwidth.

Turning back to FIG. 6, when incorporated into the system 600, the hybrid-coupled multiplexer requires only two channels, one spanning the transmit band of the PIM analyser 610, and the other spanning the receive band.

The PIM analyser 610 presents a well-matched wideband load at the port 620, which eliminates the risk of a resonant mode being excited when the in-line reflectometer 615 is performing a reflection coefficient measurement when the DUT 605 is reflective. As such, the PIM analyser 610 enables the in-line reflectometer 615 to obtain high measurement accuracy at a wide range of frequencies, including those outside of the transmit and receive bands of the PIM analyser 610, unlike the system 300 of FIG. 3.

Another advantage of the hybrid-coupled multiplexer architecture described in FIG. 7, and incorporated into the system 600, is that it allows any number of non-overlapping channels 705 to be added in cascade. This makes possible a wide range of alternative PIM analyser configurations, including a) a multiband PIM analyser capable of measuring PIM in two or more non-overlapping cellular bands on a single test port; b) a PIM analyser in which each transmit carrier is individually filtered before being combined with the other carrier at the test port, rather than combining the carriers at the transmitter output and then passing both carriers through a common filter, which is far more power-efficient than combining the two carriers with a Wilkinson combiner or quadrature hybrid, whereby half of the RF power is lost in the combining process; and c) a PIM analyser with a single transmit band and multiple receive bands.

The skilled addressee will, however, readily appreciate that the hybrid-coupled multiplexer is only one example of a reflectionless multiplexer. A reflectionless multiplexer may be configured to achieve the desired improvements in the output return loss of the PIM analyser.

In the context of the present invention, it should be understood that the term "reflectionless" is not intended to be taken literally. In practice, all radio communications devices tend to reflect some fraction of the signal power that is applied to their input and output ports. Furthermore, such devices usually have finite operating bandwidths, outside of which their return loss performance degrades rapidly. In the context of the present invention, the term "reflectionless" is representative of a multiplexer whose output return loss is sufficiently high over a sufficiently wide frequency range to ensure that when the multiplexer is connected to the upstream port of an in-line S-parameter test set, the measured signal levels inside the test set remain below the compression point of the test set's receivers at all frequencies in the test set's operating frequency range.

Depending on the specific architecture of the in-line S-parameter test set to which the multiplexer is connected, a multiplexer with an output return loss of 3 dB over a 20 MHz frequency range may be considered to be a reflectionless multiplexer. In another exemplary embodiment, a reflectionless multiplexer may be configured to provide an output return loss of 10 dB over a 1000 MHz bandwidth in order to achieve an output return loss which is sufficiently high over a sufficiently wide frequency range to ensure that when the multiplexer is connected to the upstream port of an in-line S-parameter test set, the measured signal levels inside the test set remain below the compression point of the test set's receivers at all frequencies in the test set's operating frequency range.

In addition to the high output return loss attribute, reflectionless multiplexers may also possess many of the same attributes as traditional manifold-coupled multiplexers in order to be suitable for use in a PIM analyser. The list of required attributes may include: very low residual passive intermodulation levels (typically better than −125 dBm with 2×43 dBm carriers); high transmit-to-receive isolation (typically 80-100 dB); high power handling capability in the PIM analyser's transmit band; low insertion loss in the PIM analyser's transmit and receive bands; and a wide stopband in both the transmit and receive pathways of the multiplexer, to prevent out-of-band noise, external interferers, transmitter harmonics and image-band signals from entering the PIM analyser's receiver and degrading its measurement accuracy.

Reflectionless multiplexers may be embodied in various configurations and architectures. In addition to the aforementioned hybrid-coupled multiplexers, examples of reflectionless multiplexer architectures include cascaded directional filters, manifold-coupled multiplexers with redundant channels, and circulator-coupled multiplexers. Each of these offers advantages and disadvantages.

Reflectionless multiplexers based on cascaded directional filters are functionally similar to hybrid-coupled multiplexers. Potential advantages of this configuration over the hybrid-coupled configuration include that only one filter is required per channel, whereas the hybrid-coupled configuration requires two filters per channel. Another advantage is that directional filter-based multiplexers do not require wideband quadrature hybrids, and are therefore potentially able to provide high output return loss over a much wider frequency range than the hybrid-coupled configuration. Potential disadvantages of directional filter-based multiplexers include difficulty in realising filter bandwidths greater than 1%, and the inability to implement transmission zeros in order to improve filter selectivity.

Manifold-coupled multiplexers with redundant channels are identical to traditional manifold-coupled multiplexers, but with one or more extra channel filters added. Low-PIM loads are fitted to the channel ports of the extra filters. The passbands in the extra filters are chosen to span the frequency bands between, above and below the transmit and receive filter passbands. Consequently, any signals entering the common port of the multiplexer that fall outside the PIM analyser's transmit & receive bands but inside the passbands of the extra channel filters, will pass through those filters before being absorbed by the low-PIM loads on those filters' channel ports. The multiplexer thus achieves high output return loss over the combined frequency range spanned by all of the filters. The main advantage of a manifold-coupled multiplexer with redundant channels is that the channel filters can be designed to have optimal frequency responses based on for example the Generalised Chebyshev function. Disadvantages of manifold-coupled multiplexers with redundant channels may include complexity of design and difficulty of tuning.

Circulator-coupled multiplexers comprise a cascaded set of circulators, with the last circulator in the cascade terminated in a low-PIM load. The third port of each circulator is connected to a channel filter. When used in a PIM analyser, the circulator that is connected to the transmit channel filter must circulate signals in the opposite direction to the circulator that is used with the receive filter. The low-PIM load at the end of the circulator cascade confers the network with the required wideband high output return loss response. The potential advantages of circulator-coupled multiplexers are simplicity of tuning and modularity of construction. The main disadvantage is that circulators generate relatively large levels of passive intermodulation, which is extremely undesirable for a multiplexer used in a PIM analyser. Nevertheless, some applications may exist in which this does not pose a problem, for example when performing low-power intermodulation measurements on active electronic devices, where transmit carrier levels are on the order of milliwatts or microwatts, rather than 20 watts as is the case when testing according to the IEC-62037 standard. In such cases the passive intermodulation produced by the circulators will be negligible compared to the active intermodulation produced by the electronic circuit under test. Another potential disadvantage with circulator-coupled multiplexers is that the bandwidth of many commercially-available circulators is not very wide, a fact which limits the range of frequencies in which high output return loss can be achieved.

Accordingly, an output return loss which is sufficiently high over a sufficiently wide frequency range to ensure that when the multiplexer is connected to the upstream port of an in-line S-parameter test set, the measured signal levels inside the test set remain below the compression point of the test set's receivers at all frequencies in the test set's operating frequency range, may be achieved using various reflectionless multiplexer architectures, such as hybrid-coupled multiplexers, cascaded directional filters, manifold-coupled multiplexers with redundant channels, or circulator-coupled multiplexers.

In some embodiments, the system 600 may be extended to provide a two-port configuration which permits the forward and reverse PIM response and full two-port S-parameters of the DUT to be measured in either direction. As such, embodiments of the invention comprise a two-port PIM analyser that is also capable of performing full two-port S-parameter measurements without requiring any external connection changes.

Figure 8:
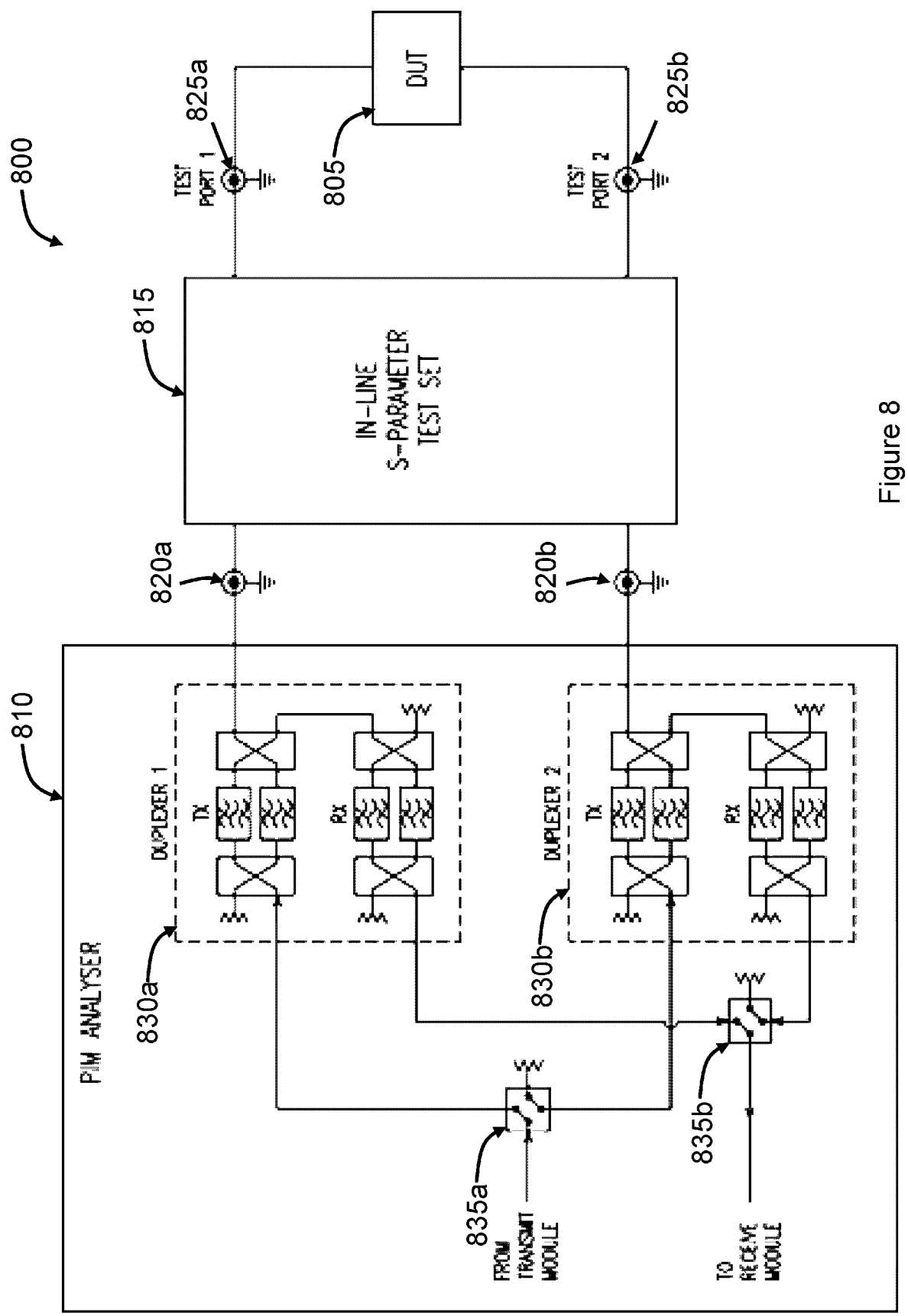
FIG. 8 illustrates a system for identifying and/or locating faults in a DUT, according to an embodiment of the present invention.

FIG. 8 illustrates a system 800 for identifying and/or locating faults in a DUT 805, according to an embodiment of the present invention. The system 800 enables two-port switchless PIM and wideband S-parameter testing and provides a high output return loss over a wide frequency range.

The system 800 includes a two-port PIM analyser 810, and a two-port in-line S-parameter test set 815, which enable PIM and wideband S-parameter testing. In particular, the PIM analyser 810 is coupled to the in-line S-parameter test set 815 by first and second input ports 820a, 820b, and the in-line S-parameter test set 815 is coupled to the DUT 805 by first and second test ports 825a, 825b.

The transmit carriers from the PIM analyser 810 can be routed to either the first or second input port 820a, 820b (and thus through a first or second hybrid-coupled duplexer 830a, 830b) via a first RF transfer switch 835a, and the PIM response of the DUT 805 can be measured on either the first or second input port 820a, 820b (and thus through either the first or second hybrid-coupled duplexer 830a, 830b) by a second RF transfer switch 835b. This allows both the forward and reverse PIM responses of the DUT 805 to be measured in either direction.

One novel aspect of this arrangement is that, by virtue of the hybrid-coupled duplexers 830a, 830b in the front end of the PIM analyser 810, the system 800 has high output return loss on both test ports 825a, 825b over a wide frequency range. This facilitates the wideband operation of the in-line S-parameter test set 815 situated between the PIM analyser 810 and the DUT 805.

The skilled addressee will readily appreciate that the in-line S-parameter test set 815 may be implemented in a variety of ways, some of which are described below.

Figure 9:
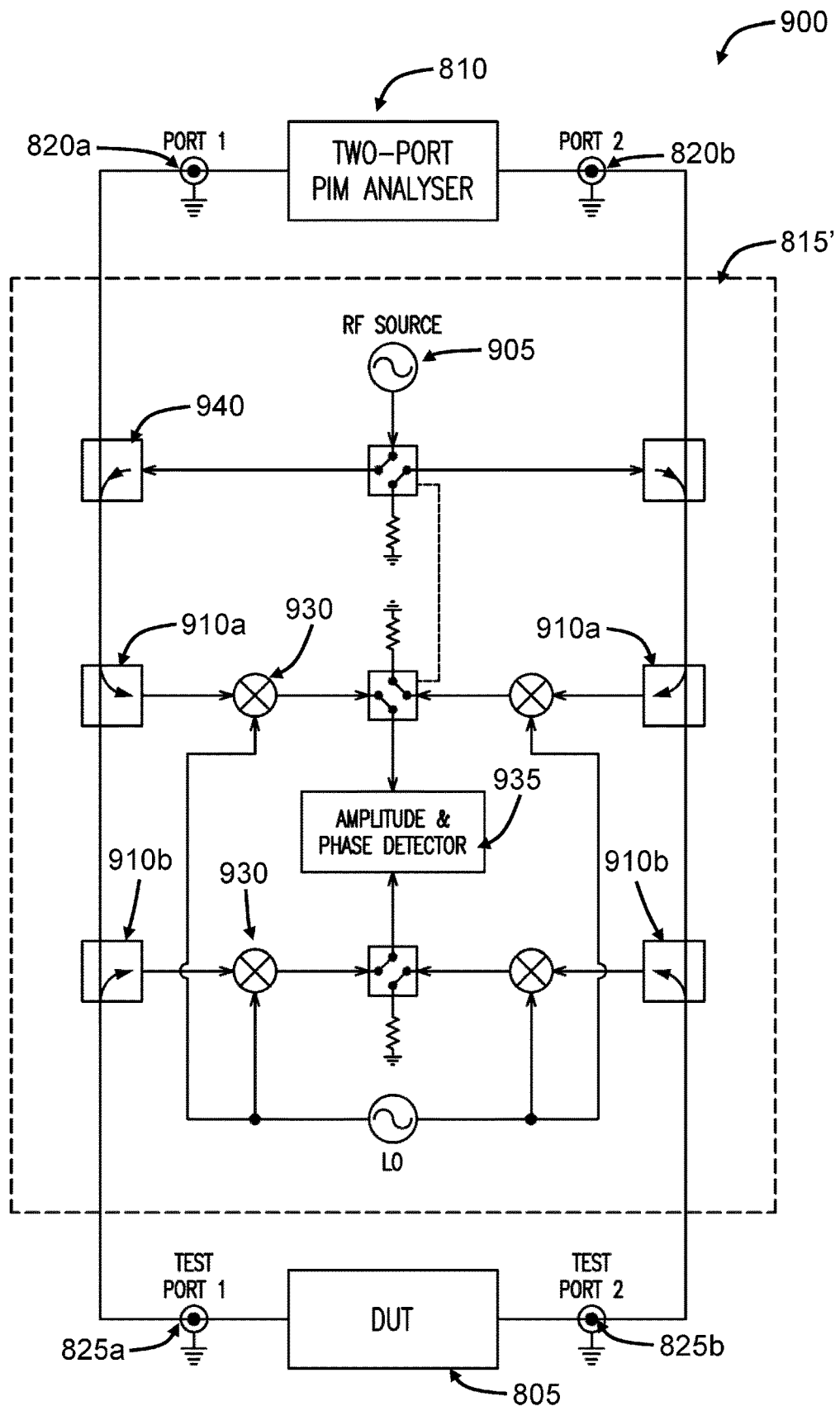
FIG. 9 illustrates a system for identifying and/or locating faults in a DUT, according to an embodiment of the present invention.

FIG. 9 illustrates a system 900 for identifying and/or locating faults in a DUT 805, according to an embodiment of the present invention. The system 900 may be similar or identical to the system 800 of FIG. 8 and includes an in-line S-parameter test set 815' interposed between the PIM analyser 810 and the DUT 805.

The system 900 allows all four S-parameters of the DUT 805 (namely, $S_{11}$, $S_{12}$, $S_{21}$ and $S_{22}$) to be measured as fully error-corrected vector quantities (i.e. quantities comprising both magnitude and phase information), from which the systematic errors relating to the test set have been eliminated.

The in-line S-parameter test set 815' is similar to a conventional vector network analyser (VNA), and includes an on-board RF source 905 for generating a test signal, a signal separation network in the form of forward and reverse directional couplers 910a, 910b before each test port 825a, 825b, multiple coherent tuned receivers 930, 955 for downconverting the forward and reverse coupled signals to an intermediate frequency, and an amplitude and phase detector module 935 for measuring the amplitude ratio and phase offset of the downconverted forward and reverse coupled signals. The test signal from the RF source 905 can be routed to either one of the instrument's test ports 825a, 825b by means of an RF transfer switch 945a. A second RF transfer switch 945b is provided so that the instrument can measure the signal emerging from either one of the forward directional couplers 910a, although in most cases the second transfer switch 945b will be set to the same test port as the RF source's transfer switch 945a. A third transfer switch 950 is provided so that the instrument can measure the signal emerging from either one of the reverse directional couplers 910b.

One important difference between the in-line S-parameter test set 815' and a conventional VNA is that the RF source 905 that generates the test signal is not connected directly to a main RF path, but is rather injected onto the main RF path via directional couplers 940 (also referred to as "source couplers"). This enables the S-parameter test set to operate as an independent in-line device situated between the PIM analyser 810 and the DUT 805.

Care must be taken in the design of the S-parameter test set to ensure that it does not impair the performance of the PIM analyser 810. In particular, the S-parameter test set 815' should have a very low residual PIM level, ideally less than −125 dBm with 2×+43 dBm carriers. Furthermore, the S-parameter test set must allow the high-power transmit carriers from the PIM analyser 810 to pass through it without suffering damage through dielectric breakdown or overheating.

It is also desirable (but not necessarily essential) that the S-parameter test set has very low insertion loss, in order to minimise its impact on the amplitude of the transmit carriers. This may be relaxed if the PIM analyser 810 is able to increase its transmit power to compensate for the insertion loss of the S-parameter test set. Finally, the S-parameter test set should ideally have high input and output return loss, in order to minimise the effects of source and load mismatch on the measurement uncertainty of the PIM analyser 810.

Before testing, the S-parameter test set is first calibrated in order to correct for systematic errors in the system 900. Many methods are available for this purpose, one of the best-known and most accurate being the "full two-port" calibration procedure, also known as the "12-term error correction" procedure or "10-term error correction" procedure, depending on whether the instrument's port-to-port leakage is accounted for in the calibration. Details of such methods can be found in Rytting, Keysight Technologies, Hiebel and Anritsu Company.

Figure 10:
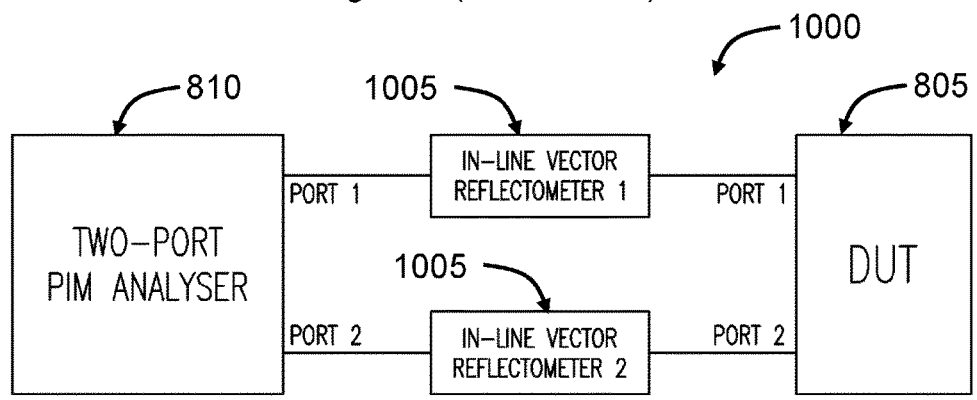
FIG. 10 illustrates a block diagram of a system for locating faults in a DUT, according to an embodiment of the present invention.

In an alternative embodiment of the present invention, a pair of in-line vector reflectometers are connected to the test ports of a two-port PIM analyser. FIG. 10 illustrates a block diagram of a system 1000 for locating faults in a DUT 805, according to an embodiment of the present invention.

The system 1000 comprises the two-port PIM analyser 810 with an in-line vector reflectometer 1005 on each port. Such configuration enables the approximate vector $S_{11}$ and $S_{22}$ of the DUT 805 to be measured, as well as the scalar magnitudes of $S_{12}$ and $S_{21}$.

It is not necessary for the reflectometers 1005 to share a common frequency reference, but it is, however, necessary for the reflectometers to have low PIM and sufficient power handling capability to pass the two carriers from the PIM analyser 810 without incurring damage.

A vector $S_{11}$ or $S_{22}$ measurement is made by simply performing a conventional reflection coefficient measurement with reflectometer 1 or 2 respectively. The results obtained in such case will in general not be as accurate as those from an S-parameter test set using 10- or 12-term error correction, due to the fact that it is not possible to correct for the load mismatch presented by the PIM analyser 810 on the output port of the DUT 805. Despite this limitation, there are a number of circumstances in which this system 100 is capable of making highly accurate $S_{11}$ and $S_{22}$ measurements. These circumstances include when the DUT 805 has a sufficiently high insertion loss to mask the load mismatch presented by the PIM analyser 810 on the output port of the DUT 805, or when the DUT 805 has low return loss compared to the insertion loss of the DUT 805 and the load mismatch presented by the PIM analyser 810.

The above cases can be generalised as follows, which is valid for both reciprocal and non-reciprocal devices alike:

$$RL_{DUT} \leq IL_{DUT}^{fwd} + IL_{DUT}^{rev} + RL_{PIM} - 20 \quad \text{(Equation 4)}$$

where
$RL_{DUT}$=input return loss of DUT in dB
$IL_{DUT}^{fwd}$=forward insertion loss of DUT in dB
$IL_{DUT}^{rev}$=reverse insertion loss of DUT in dB
$RL_{PIM}$=output return loss of PIM analyser in dB The numerical values of the parameters in Equation 4 should always be written as positive numbers. For example, the input return loss of a passive DUT, $RL_{DUT}$, should be written "15 dB", not "−15 dB", i.e. the negative sign is implicit in the word "loss".

If the DUT is a reciprocal device, Equation 4 can be simplified to:

$$RL_{DUT} \leq (2 \times IL_{DUT}) + RL_{PIM} - 20 \quad \text{(Equation 5)}$$

where
$RL_{DUT}$=input return loss of DUT in dB
$IL_{DUT}$=insertion loss of DUT in dB
$RL_{PIM}$=output return loss of PIM analyser in dB The inequalities in Equations 4 and 5 imply that if the sum (in dB) of the round-trip insertion loss through the DUT and the output return loss of the PIM analyser is at least 20 dB greater than the input return loss of the DUT itself, then the $S_{11}$ and $S_{22}$ measurement error will be no worse than ±1 dB.

For example, if the insertion loss of a reciprocal DUT is 10 dB and the output return loss of the PIM analyser is 15 dB, then in order to measure $S_{11}$ or $S_{22}$ with an accuracy of ±1 dB, the input return loss of the DUT must be less than or equal to (2×10)+15−20=15 dB.

Scalar $S_{21}$ and $S_{12}$ transmission measurements are performed using an Enhanced Response Calibration method as described in Keysight Technologies and Potter, but with a pair of in-line reflectometers rather than a conventional one-port reflectometer and power meter.

The Enhanced Response Calibration method does not provide the same level of accuracy as a 10- or 12-term error correction procedure, due to the fact that it is not possible to correct for the load mismatch presented by the PIM analyser on the output port of the DUT. The method does however correct for the source mismatch presented by the PIM analyser on the input port of the DUT.

To calibrate the system, an OSL calibration is performed on each reflectometer. The reflectometers are then connected together at their test ports, and a receiver alignment procedure is performed in order to correct for the frequency errors that inevitably exist between the on-board RF sources and local oscillators in each instrument. This is followed by a normalisation sweep to determine the transmission tracking coefficient.

To perform a scalar transmission measurement, a test signal is generated by the first reflectometer and applied to the input port of the DUT. The first reflectometer measures the reflection coefficient and incident power at the input port of the DUT, correcting for the effects of source mismatch. The power emerging from the output port of the DUT is measured using the reverse coupler in the second reflectometer. The scalar transmission coefficient is obtained by computing the ratio of the received and transmitted powers in watts, and converting the result to decibels (dB). Alternatively, the same result can be obtained by taking the difference between the received and transmitted powers in decibel-milliwatts (dBm).

In an alternative embodiment, the in-line vector reflectometer is modified to allow the stimulus level to be adjusted dynamically during a return loss sweep, in order to prevent the reflectometer's receivers from saturating. In such an embodiment, a legacy PIM analyser may be used and dynamic source power control in the in-line vector reflectometer may be implemented in a number of ways.

Figure 11:
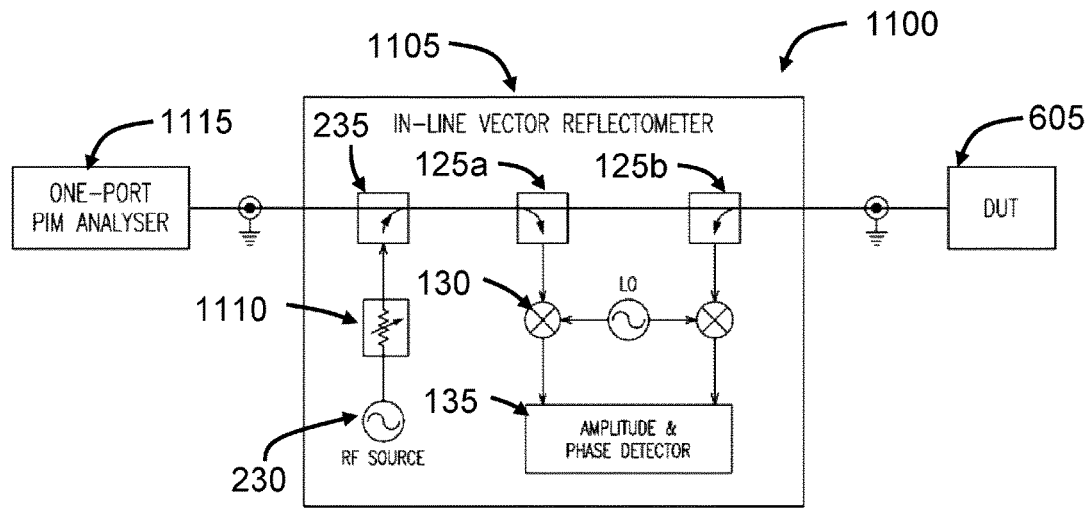
FIG. 11 illustrates a block diagram of a system for locating faults in a DUT, according to an embodiment of the present invention.

FIG. 11 illustrates a block diagram of a system 1100 for locating faults in a DUT 605, according to an embodiment of the present invention. The system 1100 includes an in-line vector reflectometer 1105 similar to the reflectometer 615 of the system 600, but with a variable attenuator 1110 on an output of the RF source 230, i.e. between the RF source 230 and the source coupler 235. As such, a one-port PIM analyser 1115 may be used that is a legacy PIM analyser.

During the course of a return loss sweep, the reflectometer 1105 continuously monitors the receiver output levels. In the event that either of the two signal levels goes outside acceptable limits, the control software of the reflectometer 1105 pauses the sweep and changes the settings of the variable attenuator 1110 such that the signal level(s) are brought up or down to an appropriate level. The sweep then resumes with the new settings, and the process repeats until the end of the frequency sweep is reached.

Figure 12:
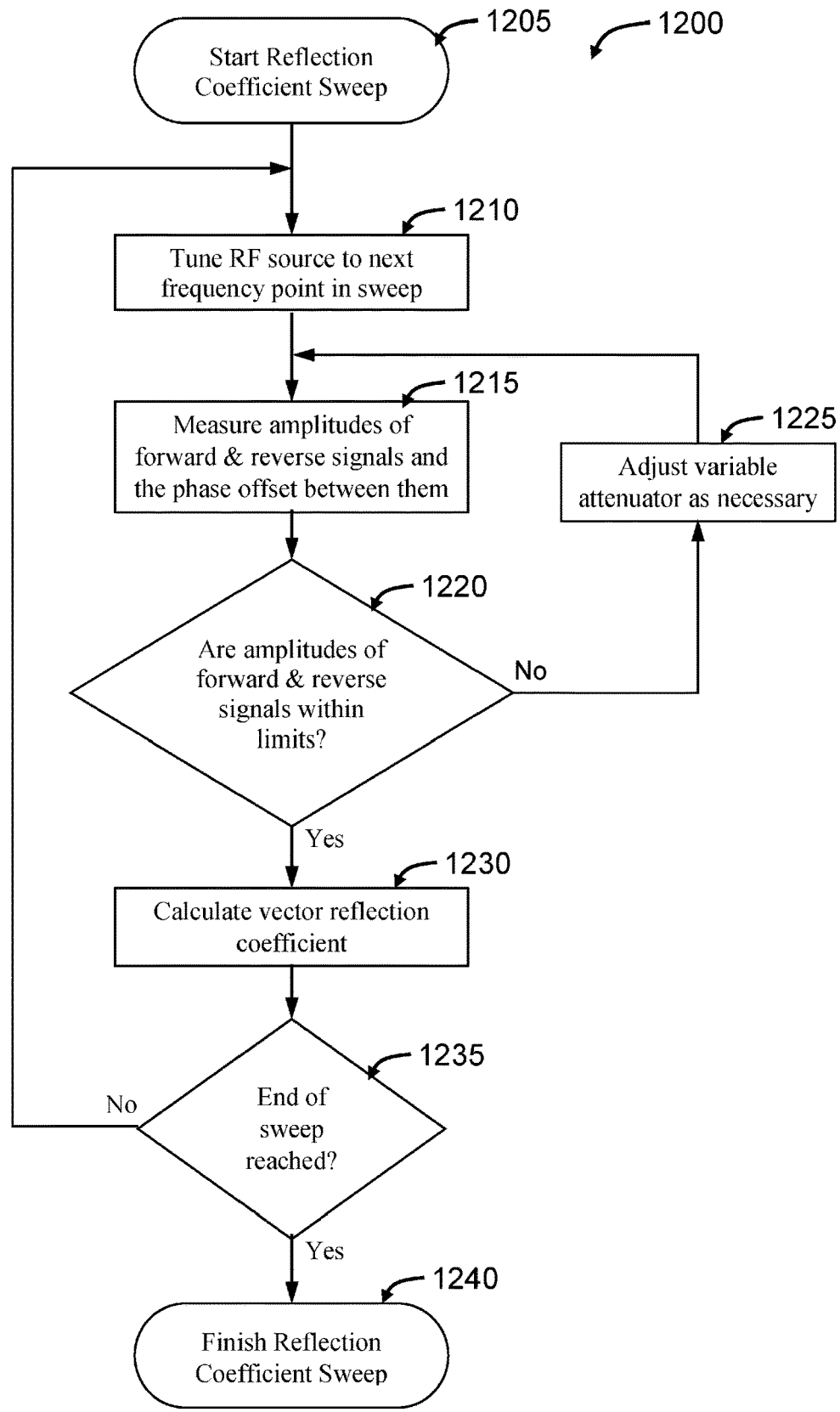
FIG. 12 illustrates a method of return loss measurement, according to an embodiment of the present invention.

FIG. 12 illustrates a method of return loss measurement 1200, according to an embodiment of the present invention. The method 1200 may be implemented in the system 1100.

At step 1205, the reflection coefficient sweep is started, much like in a traditional reflectometer, and at step 1210, the RF source is tuned to the next frequency point in the sweep.

At step 1215, the amplitudes of forward and reverse signals, and the phase offset between them, is measured, and if outside of acceptable limits, the variable attenuator is adjusted in step 1225. Step 1215 is then repeated with the new settings.

If the amplitudes of forward and reverse signals, and the phase offset between them are within acceptable limits, the vector reflection coefficient is calculated at step 1230.

At step 1235, it is determined whether the end of the sweep has been reached. If not, the method is repeated from step 1210 at the next frequency point in the sweep. Alternatively, the reflection coefficient sweep is finished at 1240.

The system 1100 may be extended to a two-port configuration which permits the forward and reverse PIM responses and the full two-port S-parameters of a DUT to be measured in either direction.

Figure 13:
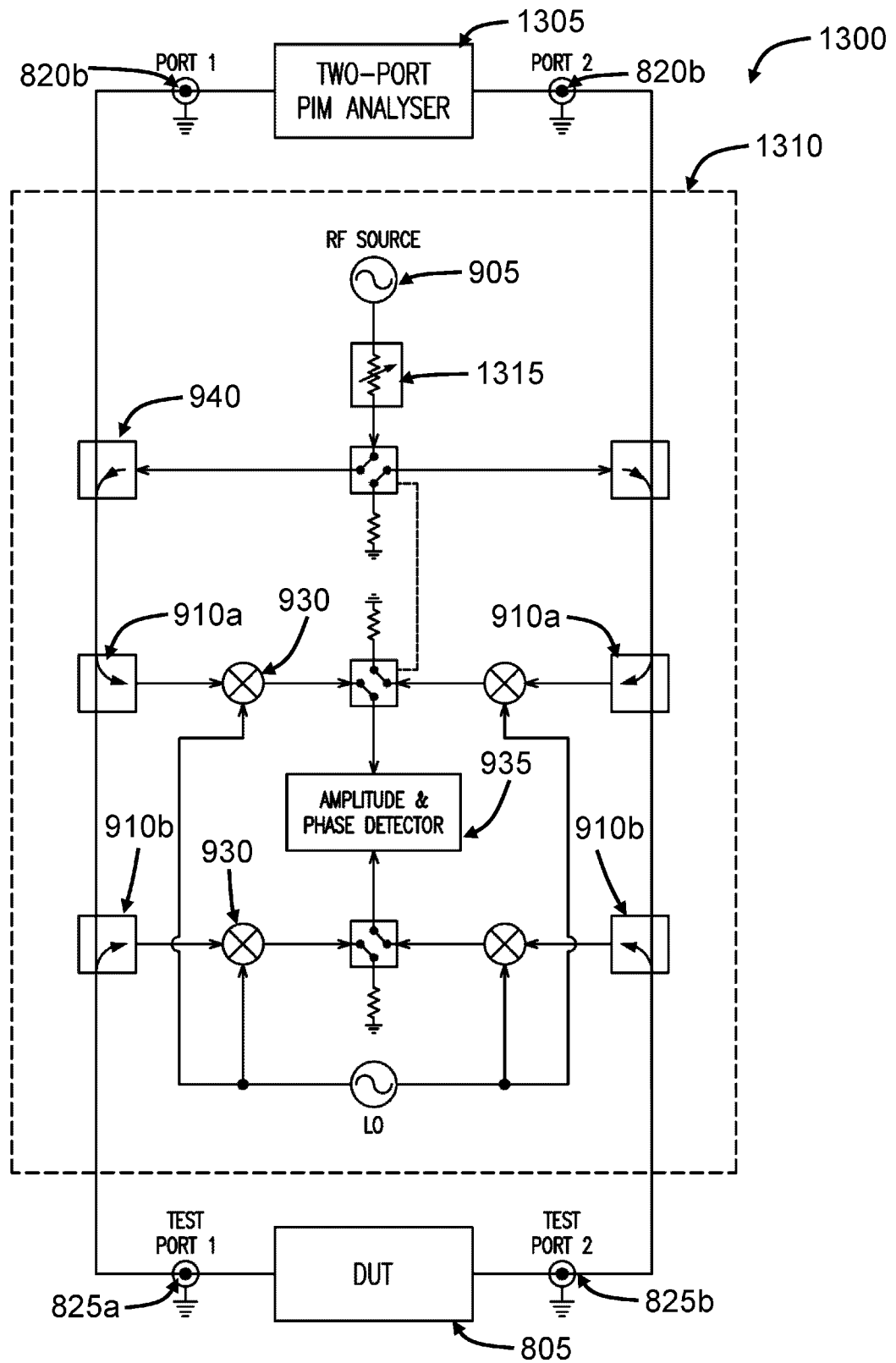
FIG. 13 illustrates a system for locating faults in a DUT, according to an embodiment of the present invention.

FIG. 13 illustrates a system 1300 for locating faults in a DUT 805, according to an embodiment of the present invention. The system 1300 is similar to the system 900 of FIG. 9, but with a two-port PIM analyser 1305 without any restrictions being placed on the output return loss thereof.

This, however, creates the risk of a resonant mode being excited between the PIM analyser 1305 and the DUT 805 in the event that both devices simultaneously have poor return loss at the S-parameter measurement frequency. This can occur between Port 1 820a of the PIM analyser 1305 and the DUT input port 825a, or between Port 2 820b of the PIM analyser 1305 and the DUT output port 825b, or on both ports at the same time. This in turn can cause receiver saturation in the S-parameter test set, resulting in a loss of measurement accuracy.

To prevent this from occurring, a modified S-parameter test set 1310 is provided including a variable attenuator 1315 fitted to the output of the RF source 905, to allow the stimulus level to be reduced if any of the received signal levels exceed the upper operating limit of the S-parameter test set. The variable attenuator 1315 is used in the same manner as the attenuator 1110 of FIG. 11, and may utilise the method 1200 of FIG. 12.

In particular, the variable attenuator 1315 allows the test signal level to be dynamically adjusted to avoid receiver saturation in the S-parameter test set. As such, no restrictions are placed on the output return loss of the PIM analyser, and thus the system 1300 can be used with a PIM analyser according to the prior art.

In yet another embodiment, a fixed attenuator is inserted between the PIM analyser and the in-line vector reflectometer to improve the output return loss of the PIM analyser.

Figure 14:
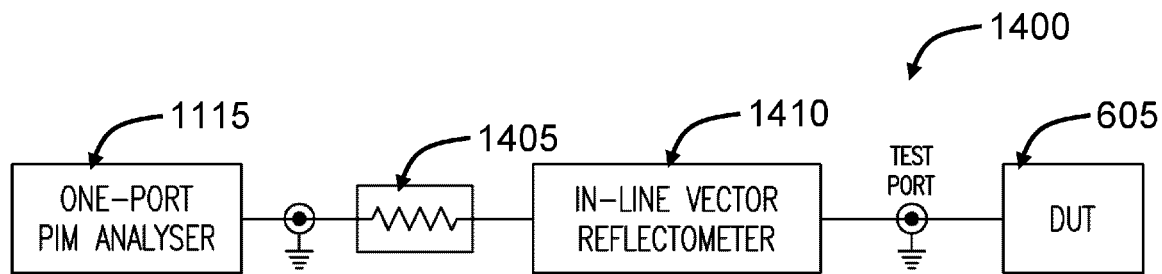
FIG. 14 illustrates a block diagram of a system for locating faults in a DUT, according to an embodiment of the present invention.

FIG. 14 illustrates a block diagram of a system 1400 for locating faults in a DUT 605, according to an embodiment of the present invention. The system 1400 is similar to the system 1100, but includes a fixed attenuator 1405 between the PIM analyser 1115 and an in-line vector reflectometer 1410 instead of having dynamic power control in the reflectometer 1410. The in-line reflectometer 1410 may be similar or identical to the reflectometer 615 of FIG. 6. No restrictions are placed on the output return loss response of the PIM analyser 1115 in the system 1400.

Such configuration improves the output return loss of the PIM analyser 1115 by an amount equal to twice the insertion loss of the attenuator 1405. With a suitably chosen level of attenuation, it is possible to avoid saturating the reflectometer's receivers even when measuring a highly reflective DUT 605 at frequencies outside of the transmit and receive bands of the PIM analyser 1115.

As an illustrative example, the attenuator 1405 may have an insertion loss of 3 dB. This ensure that the worst-case output return loss of the PIM analyser 1115 is at least 6 dB (i.e. twice the insertion loss of the attenuator 1405), even in the PIM analyser's stopband. In the case of a highly reflective DUT 605 (e.g. input return loss=0 dB), then using Equations 1 and 2 it can be seen that the maximum resonance-induced power rise at the outputs of the forward and reverse couplers in the reflectometer is 6 dB. This is much lower than the 30 dB power rise that can occur without the attenuator, thereby greatly reducing the risk of receiver saturation and the corresponding loss of measurement accuracy that accompanies it.

The attenuator that is fitted between the PIM analyser and the in-line reflectometer must generally be able to handle the peak instantaneous power in the two transmit carriers without experiencing dielectric breakdown, be able to dissipate the heat generated by the two transmit carriers as they pass through the attenuator, without suffering damage or changes in the RF performance of the attenuator, and have a very low residual PIM (preferably less than −125 dBm@2×+43 dBm power per carrier).

The system 1400 may be used with a prior art in-line vector reflectometer. A legacy PIM analyser can be used, provided that the PIM analyser 1115 can increase the levels of its transmit carriers enough to compensate for the insertion loss of the attenuator 1405. This is important, as the PIM analyser 1115 must still be able to test the DUT 605 according to the IEC-62037 standard, which stipulates that PIM testing on passive devices be performed with 2×+43 dBm carriers applied at the input to the DUT 605. If the PIM analyser 1115 cannot generate the required transmit carrier levels, it may be desirable to modify its design.

In such case, the PIM analyser 1115 may be modified by a) modifying the power amplifiers to produce the necessary additional power; b) using the power amplifiers in a pulsed mode of operation rather than a continuous-wave (CW) mode of operation, thereby allowing higher power levels to be generated for brief time intervals (e.g. 100 milliseconds); or c) combining the two transmit tones using a diplexer rather than a quadrature hybrid or Wilkinson combiner, thereby increasing the output power at the instrument's test port by 3 dB.

The system 1400 may also be extended into a two-port configuration which permits the measurement of the forward and reverse PIM responses and two-port S-parameters of a DUT 805, in either direction.

Figure 15:
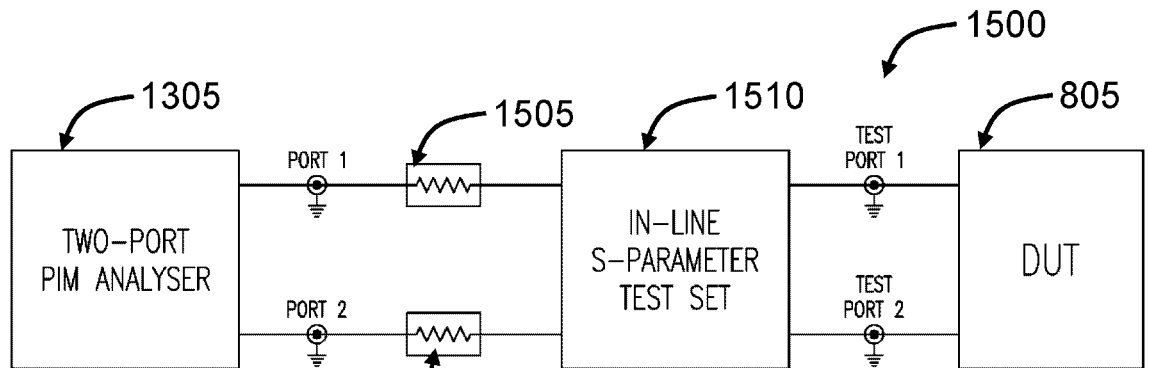
FIG. 15 illustrates a block diagram of a system for locating faults in a DUT, according to an embodiment of the present invention.

FIG. 15 illustrates a block diagram of a system 1500 for locating faults in a DUT 805, according to an embodiment of the present invention. The system 1500 is similar to the system 800, but includes fixed attenuators 1505 between the PIM analyser 1305 and an in-line S-parameter test set 1510. The in-line S-parameter test set 1510 may be similar or identical to the test set 815 of FIG. 8. Note that, unlike the system 800, no restrictions are placed on the output return loss response of the PIM analyser 1305 in the system 1500.

In particular, an attenuator 1505 is fitted onto each port of the PIM analyser 1305, between the PIM analyser and the S-parameter test set 1510. The attenuators 1505 are high-power, low-PIM attenuators to provide a minimum guaranteed output return loss over a wide frequency range.

This arrangement is compatible with both the 12-term and 10-term error correction procedures, mentioned above, which are generally regarded as two of the most accurate S-parameter measurement techniques for two-port devices.

The performance requirements for the attenuators 1505 are similar to those of the attenuator 1405, and include a high voltage breakdown strength, an ability to dissipate the necessary RF power without damage or changes in performance, and a very low residual PIM.

The in-line full two-port S parameter test set 1510 can be implemented in a number of ways, for example as mentioned above.

As was the case for the system 1400, the PIM analyser 1305 must be capable of raising the levels of its transmit carriers by an amount sufficient to compensate for the insertion loss of the attenuators. This is to ensure that the PIM analyser can deliver 2×+43 dBm tones to the input port of the DUT in accordance with the IEC-62037 standard. If the PIM analyser is unable to increase its transmit carrier levels by the required amount, the design of the PIM analyser may need to be modified, as described with reference to the PIM analyser 1115.

Figure 16:
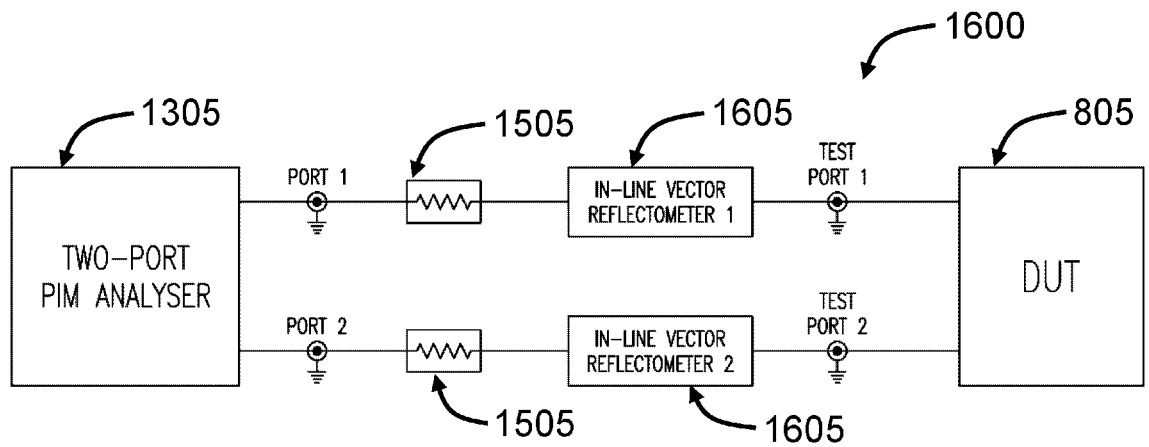
FIG. 16 illustrates a block diagram of a system for locating faults in a DUT, according to an embodiment of the present invention.

FIG. 16 illustrates a block diagram of a system 1600 for locating faults in a DUT 805, according to an embodiment of the present invention. The system 1600 is similar to the system 1500, but includes a pair of in-line vector reflectometers 1605 between the attenuators 1505 and the DUT 805.

In particular, the two-port PIM analyser 1305 is fitted with an attenuator 1505 on each of its test ports, and the output ports of the attenuators 1505 are connected to upstream ports of a pair of in-line vector reflectometers 1605. The vector reflectometers 1605 may be similar or identical to the vector reflectometers 1005 of FIG. 10. The test ports of the vector reflectometers 1605 are connected to the input and output ports of the DUT 805.

The system 1600 is capable of performing scalar $S_{11}$ and $S_{21}$ measurements using the Enhanced Response Calibration procedure, mentioned above, which corrects for source mismatch but is unable to correct for load mismatch. As such, the system 1600 does not provide the same level of accuracy as the 12-term or 10-term error correction approaches.

This system 1600 is also capable of performing vector $S_{11}$ and $S_{22}$ measurements, although the accuracy of the results will vary depending on the insertion loss of the DUT 805, the output return loss of the PIM analyser 1305, and the return loss of the DUT 805 itself.

Equation 4, above, can be used to guarantee an accuracy of ±1 dB in the measured values of $S_{11}$ and $S_{22}$.

The PIM or S-parameter testing described in the embodiments above may be performed at any suitable frequency band in the electromagnetic spectrum, including microwave, millimetre-wave and optical bands.

Embodiments of the present invention described above enable an in-line vector reflectometer to perform vector reflection coefficient measurements across an unrestricted frequency range while connected to a PIM analyser. The methods and systems may have particular use in RTF modules, but are applicable to any in-line vector reflectometer.

An in-line vector reflectometer is provided that can be extended into a two-port in-line S-parameter test set capable of measuring all four S-parameters of a two-port DUT over an unrestricted frequency range, while being simultaneously connected to a two-port PIM analyser.

In some embodiments, a wideband in-line one-port or two-port S-parameter test set is provided that can be connected to a PIM analyser in such a way that the resulting apparatus can measure both the PIM and S-parameters of a DUT without requiring any physical connection changes or RF switches.

The S-parameter test set is capable of making accurate S-parameter measurements over a wide range of frequencies, including frequencies outside of the transmit and receive bands of the PIM analyser, even when the DUT is highly reflective. Furthermore, the S-parameter test set does not degrade the residual PIM response or noise floor of the PIM analyser.

The PIM analyser is capable of applying 2 transmit carriers at a level of +43 dBm per carrier to the input port of the DUT, in accordance with the IEC-62037 standard ("Passive RF and microwave devices, intermodulation level measurement") when the S-parameter test set is connected between the PIM analyser and the DUT Advantageously, a VNA is no longer required because wideband S-parameter measurements can be performed with the in-line vector reflectometer (or S-parameter test set), without impairing the operation of the PIM analyser. This represents a major cost saving to the user, as VNAs are expensive to purchase and maintain.

Furthermore, the systems and methods described above enable fast and efficient PIM and S-parameter testing, as there is no need for any physical connection changes from one test to the next. This further reduces wear and tear on connector(s) of the DUT, as only one physical connection is required in order to perform both PIM and S-parameter tests.

Yet further again, embodiments of the invention do not require an RF switch between PIM and S-parameter test equipment, making it cheaper, faster and more reliable than an RF switch-based solution.

Finally, PIM and S-parameter test results can be collated into a final report more easily, due to the fact that they are acquired with a single integrated measurement system. This is faster, easier and less error-prone than trying to merge data from two independent test instruments.

In the present specification and claims (if any), the word 'comprising' and its derivatives including 'comprises' and 'comprise' include each of the stated integers but does not exclude the inclusion of one or more further integers.

Reference throughout this specification to 'one embodiment' or 'an embodiment' means that a particular feature, structure, or characteristic described in connection with the embodiment is included in at least one embodiment of the present invention. Thus, the appearance of the phrases 'in one embodiment' or 'in an embodiment' in various places throughout this specification are not necessarily all referring to the same embodiment. Furthermore, the particular features, structures, or characteristics may be combined in any suitable manner in one or more combinations.

In compliance with the statute, the invention has been described in language more or less specific to structural or methodical features. It is to be understood that the invention is not limited to specific features shown or described since the means herein described comprises preferred forms of putting the invention into effect. The invention is, therefore, claimed in any of its forms or modifications within the proper scope of the appended claims (if any) appropriately interpreted by those skilled in the art.

CITATION LIST

D. K. Rytting, "Network Analyzer Error Models and Calibration Methods," in *62nd ARFTG Conference Short Course Notes*, Boulder, 2003.

Keysight Technologies, "Applying Error Correction to Network Analyzer Measurements," *Application Note* 5965-7709E, 31 Jul. 2014.

M. Hiebel, in *Fundamentals of Vector Network Analysis*, Rohde & Schwarz, 2007, pp. 119-122.

Anritsu Company, "Understanding VNA Calibration," *Application Note* 111410-00673B, December 2012.

C. Potter, "Improved Scalar Transmission Measurements using Vector Source Match Correction," in *44th ARFTG Conference Digest*, Boulder, 1994.

R. J. Cameron, "Design of manifold-coupled multiplexers", IEEE Microwave Magazine 8, 2007.

The invention claimed is:

1. A system for identifying faults in a radio frequency device under test, the system comprising:
 a passive intermodulation test module, configured to perform passive intermodulation testing of the device under test on at least one test port; and
 an in-line S-parameter test set, coupled to the passive intermodulation test module and intermediate the passive intermodulation test module and at least one test port, and configured to perform wideband S-parameter testing of the device under test, at frequencies both inside and outside of transmit and receive bands of the passive intermodulation test module, on the at least one test port,
 wherein the passive intermodulation test module includes:

a transmit module configured to provide, on the at least one test port, at least one test signal for passive intermodulation testing the device under test; and a receive module configured to receive, on the at least one test port, passive intermodulation signals produced by the device under test in response to the test signal, and wherein the transmit module and the receive module are coupled to the at least one test port by a reflectionless multiplexer.

2. The system according to claim 1, wherein the reflectionless multiplexer is a hybrid-coupled multiplexer.

3. The system according to claim 2, wherein the hybrid-coupled multiplexer includes two or more independent channelizing networks connected in cascade followed by a matched load.

4. The system of claim 3, wherein at least one of the two or more independent channelizing networks comprises two quadrature hybrids and a pair of identical filters.

5. The system of claim 3, wherein the two or more independent channelizing networks include one channelizing network spanning a transmit band of the passive intermodulation test module, and a second channelizing network spanning a receive band of the passive intermodulation test module.

6. The system of claim 1, wherein the passive intermodulation test module is configured to perform passive intermodulation testing of the device under test on a plurality of test ports, and wherein the passive intermodulation test module is coupled to each of the plurality of test ports by one of a plurality of reflectionless multiplexers.

7. The system of claim 1, wherein the in-line S-parameter test set comprises a range-to-fault module.

8. The system of claim 1, wherein the in-line S-parameter test set comprises a vector reflectometer.

9. The system of claim 1, wherein the in-line S-parameter test set comprises a first and a second separate in-line reflectometer, wherein the first in-line reflectometer is coupled to a first test port of the at least one test port and the second in-line reflectometer is coupled to a second test port of the at least one test port.

10. The system of one of claim 1, wherein the in-line S-parameter test set includes an RF source, for generating a test signal, coupled onto an RF path between an input and an output of the in-line S-parameter test set by one or more directional couplers.

11. A system for identifying faults in a radio frequency device under test, the system comprising a passive intermodulation test module configured to perform passive intermodulation testing of the device under test on at least one test port, the passive intermodulation test module comprising:

a transmit module configured to provide, on at least one test port, at least one test signal for passive intermodulation testing a device under test; and a receive module configured to receive, on the at least one test port, passive intermodulation signals produced by the device under test in response to the test signal, wherein the transmit module and the receive module are coupled to the at least one test port by a reflectionless multiplexer.

12. The system of claim 11, further comprising:

an in-line S-parameter test set, coupled to the passive intermodulation test module and intermediate the passive intermodulation test module and the at least one test port, and configured to perform wideband S-parameter testing of the device under test on the at least one test port.

13. A passive intermodulation test module configured to perform passive intermodulation testing of a device under test on at least one test port, the passive intermodulation test module comprising:

a transmit module configured to provide, on at least one test port, at least one test signal for passive intermodulation testing a device under test; and a receive module configured to receive, on the at least one test port, passive intermodulation signals produced by the device under test in response to the test signal;

wherein the transmit module and the receive module are coupled to the at least one test port by a reflectionless multiplexer.

14. The passive intermodulation test module according to claim 13, wherein the reflectionless multiplexer comprises a hybrid-coupled multiplexer.

15. The passive intermodulation test module according to claim 14, wherein the hybrid-coupled multiplexer includes two or more independent channelizing networks connected in cascade followed by a matched load.

16. The passive intermodulation test module according to claim 15, wherein at least one of the two or more independent channelizing networks comprises two quadrature hybrids and a pair of identical filters.

17. The passive intermodulation test module according to claim 15, wherein each of the two or more independent channelizing networks corresponds to a different frequency range.

18. The passive intermodulation test module according to claim 15, wherein the two or more independent channelizing networks include one channelizing network spanning a transmit band of the passive intermodulation test module, and a second channelizing network spanning a receive band of the passive intermodulation test module.

* * * * *